US012592694B2

(12) United States Patent
Ito

(10) Patent No.: US 12,592,694 B2
(45) Date of Patent: Mar. 31, 2026

(54) INTEGRATED CIRCUIT

(71) Applicant: FUJI ELECTRIC CO., LTD.,
Kawasaki (JP)

(72) Inventor: Yuichi Ito, Matsumoto (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 83 days.

(21) Appl. No.: 18/598,655

(22) Filed: Mar. 7, 2024

(65) Prior Publication Data

US 2024/0380398 A1 Nov. 14, 2024

(30) Foreign Application Priority Data

May 11, 2023 (JP) ................................. 2023-078406

(51) Int. Cl.
*H03K 17/56* (2006.01)
*G01L 9/04* (2006.01)
(52) U.S. Cl.
CPC ............... *H03K 17/56* (2013.01); *G01L 9/04* (2013.01)
(58) Field of Classification Search
CPC ................................................... G01R 17/105
See application file for complete search history.

(56) References Cited

U.S. PATENT DOCUMENTS 4,419,620 A * 12/1983 Kurtz ..................... G01D 3/021
323/280
5,528,940 A 6/1996 Yamamoto et al.

FOREIGN PATENT DOCUMENTS

| JP | H06-148015 A | 5/1994 |
|----|--------------|--------|
| JP | 2797880 B2 | 9/1998 |
| JP | 3584803 B2 | 11/2004 |
| JP | 6695453 B1 * | 5/2020 |

* cited by examiner

*Primary Examiner* — Daniel C Puentes
(74) *Attorney, Agent, or Firm* — Rabin & Berdo, P.C.

(57) ABSTRACT

An integrated circuit includes a Wheatstone bridge and a bias voltage circuit. The Wheatstone bridge includes a first resistor connected between a first node on a high potential side at which a predetermined voltage is generated and a second node, a second resistor connected between the second node and a third node on a low potential side, a third resistor connected between the first node and a fourth node, and a fourth resistor connected between the fourth node and the third node. The bias voltage circuit includes a fifth resistor having a first end connected to the third node and a second end, and a first operational amplifier circuit having an inverting input terminal to which the second end of the fifth resistor is connected, a non-inverting input terminal configured to receive a reference voltage lower than the predetermined voltage, and an output terminal connected to the third node.

8 Claims, 6 Drawing Sheets

35

INTEGRATED CIRCUIT

CROSS-REFERENCE TO RELATED APPLICATIONS

The present application claims priority pursuant to 35 U.S.C. § 119 from Japanese patent application number 2023-078406 filed on May 11, 2023, the entire disclosure of which is hereby incorporated by reference herein.

BACKGROUND

Technical Field

The present disclosure relates to an integrated circuit.

Description of the Related Art

Integrated circuits include circuits that detects pressure using a Wheatstone bridge including four gauges (for example, Japanese Patent Nos. 3584803 and 2797880, and Japanese Patent Application Publication No. H6-148015).

If an integrated circuit including a Wheatstone bridge is used for a long period of time, the sensitivity for detecting pressure may change due to change in the resistance values of gauge resistances, and the like, which may reduce the accuracy of the output voltage of the Wheatstone bridge.

SUMMARY

An aspect of the present disclosure is an integrated circuit comprising: a Wheatstone bridge; and a bias voltage circuit, the Wheatstone bridge including a first resistor connected between a first node on a high potential side at which a predetermined voltage is generated and a second node, a second resistor connected between the second node and a third node on a low potential side, a third resistor connected between the first node and a fourth node, and a fourth resistor connected between the fourth node and the third node, the bias voltage circuit including a fifth resistor having a first end connected to the third node and a second end, and a first operational amplifier circuit having an inverting input terminal to which the second end of the fifth resistor is connected, a non-inverting input terminal configured to receive a reference voltage lower than the predetermined voltage, and an output terminal connected to the third node.

DETAILED DESCRIPTION

Figure 1:
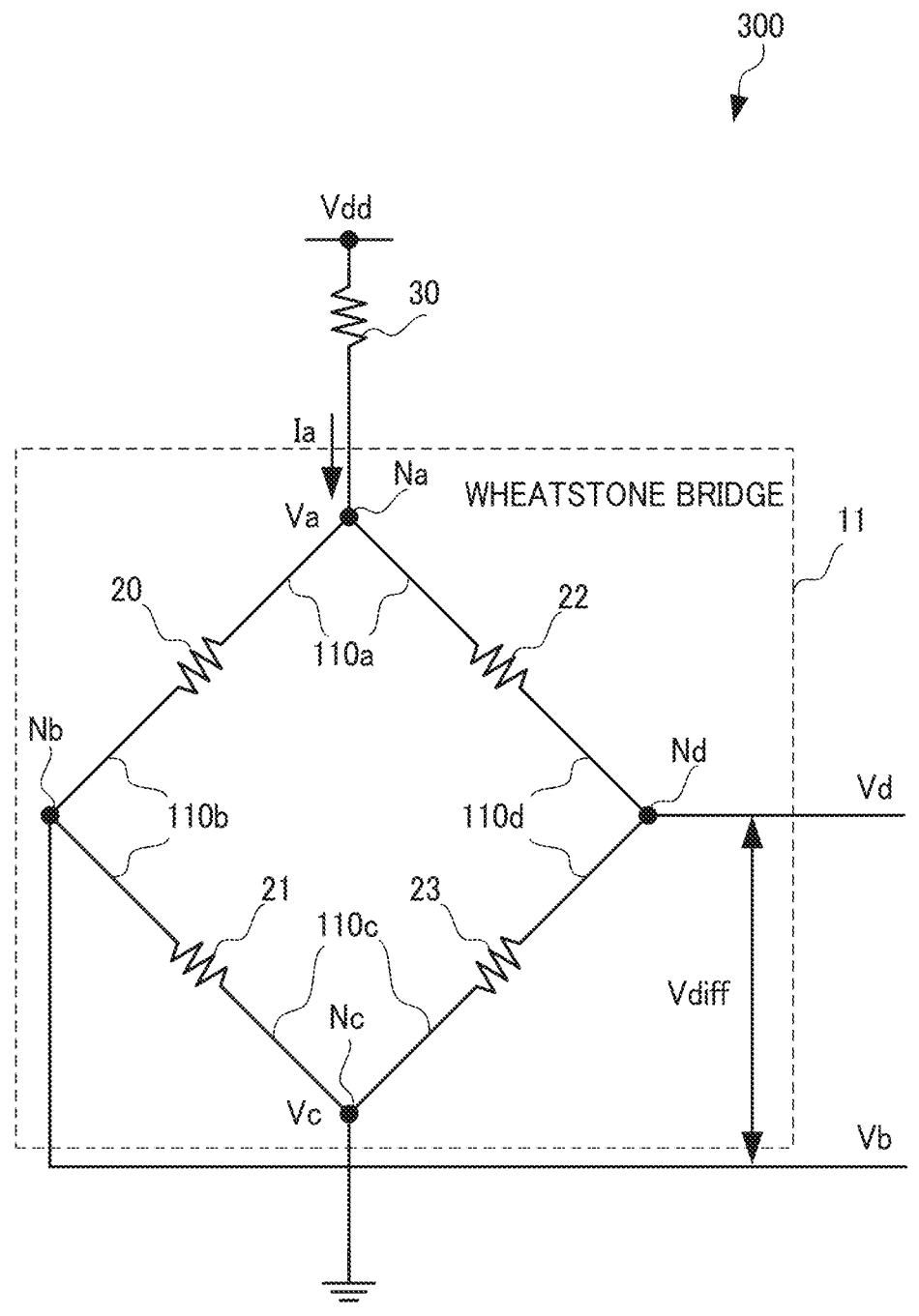
FIG. 1 is a diagram illustrating an example of a circuit 300 including a typical Wheatstone bridge 11.

At least following matters will become apparent from descriptions of the present specification and the accompanying drawings. Hereinafter, an embodiment of the present disclosure will be described with reference to the drawings. The same or equivalent constituent elements, members, and the like illustrated in the drawings are given the same reference numerals, and repetitive description is omitted as appropriate.

====Example of Circuit 300 Including Typical Wheatstone Bridge 11====

FIG. 1 is a diagram illustrating an example of a circuit 300 including a typical Wheatstone bridge 11. The circuit 300 includes the Wheatstone bridge 11 and a resistor 30. The Wheatstone bridge 11 includes resistors 20 to 23. Specifically, the Wheatstone bridge 11 includes the resistor 20 connected between a node Na on the high potential side and a node Nb, the resistor 21 connected between the node Nb and a node Nc on the low potential side, and the resistor 22 connected between the node Na and a node Nd, and the resistor 23 connected between the node Nd and the node Nc. Here, the nodes Nb and Nd are nodes to output a differential voltage Vdiff, and the node Nc is grounded.

Note that the resistance values of the resistors 20 to 23 are referred to as resistance value R1, the wiring between the resistors 20 and 22 is referred to as wiring 110a, the wiring between the resistors 20 and 21 is referred to as wiring 110b, the wiring between the resistors 21 and 23 is wiring 110c, and the wiring between the resistors 22 and 23 is referred to as wiring 110d. Further, the voltages at nodes Na, Nb, Nc, and Nd are referred to as voltages Va, Vb, Vc, and Vd, respectively, and the difference between the voltages Vb and Vd is referred to as differential voltage Vdiff. Further, the current flowing to the Wheatstone bridge 11 through the node Na is referred to as current Ia.

Further, the resistor 30 is an element to control the current Ia flowing to the Wheatstone bridge 11, and has one end configured to receive the power supply voltage Vdd, and the other end connected to the node Na. The current Ia flowing through the resistor 30 flows to the Wheatstone bridge 11 through the node Na.

For example, the circuit 300 is used as part of a pressure sensor. Further, although the details will be described later, the Wheatstone bridge 11 is formed on a diaphragm 100 (described later). Further, with the resistance values of the resistors 20 to 23 changing with deformation of the shape of the diaphragm 100 caused by pressure, the Wheatstone bridge 11 outputs the differential voltage Vdiff according to the pressure.

When the circuit 300 is used for a long period of time, the resistance values of the resistors 20 to 23 change. In this case, the voltage Va at the node Na is a voltage obtained by dividing the power supply voltage Vdd by the combined resistance Ra of the Wheatstone bridge 11 (i.e., the combined resistance of the resistors 20 to 23) and the resistor 30. When the combined resistance Ra changes with change in the resistance values of the resistors 20 to 23, the voltage Va will change. For example, if the resistance values of the resistors 20 to 23 decrease by 10%, the combined resistance Ra results in 0.9× R1. Accordingly, the voltage Va at the node Na changes from Vdd×R1/(R1+R2) to Vdd×0.9×R1/(0.9×R1+R2), where R2 is the resistance value of the resistor 30. However, the parasitic resistance of the wiring 110a to 110d is ignored.

In this case, the voltage (Va–Vc) applied to the Wheatstone bridge 11 changes, and even if the same pressure is applied to the Wheatstone bridge 11, the influence of the change in the resistance values of the resistors 20 to 23 will appear in the differential voltage Vdiff.

Thus, it is considered to reduce the influence of the change in the resistance values of the resistors 20 to 23 on the differential voltage Vdiff, by maintaining the voltage Va at the node Na at a predetermined voltage so that the voltage (Va−Vc) is constant. Accordingly, the following describes a circuit 310 capable of maintaining the voltage Va at the node Na at the predetermined voltage regardless of the change in the resistance values of the resistors 20 to 23.

=====Example of Circuit 310 Including Typical Wheatstone Bridge 11=====

Figure 2:
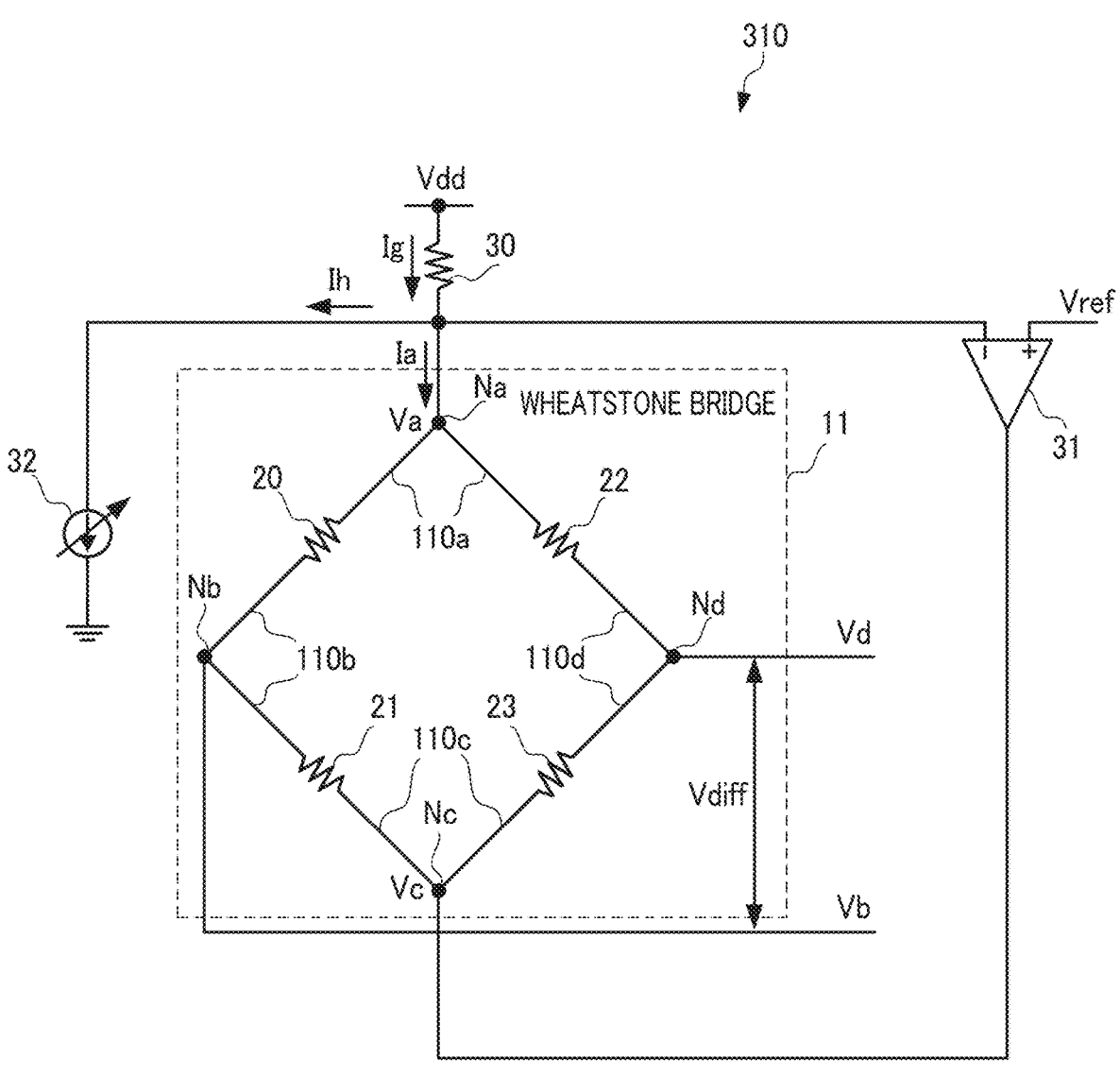
FIG. 2 is a diagram illustrating an example of a circuit 310 including a typical Wheatstone bridge 11.

FIG. 2 is a diagram illustrating an example of the circuit 310 including the typical Wheatstone bridge 11. The circuit 310 includes the Wheatstone bridge 11, the resistor 30, an operational amplifier circuit 31, and a current source 32.

The operational amplifier circuit 31 maintains, together with the Wheatstone bridge 11 and the current source 32, the voltage Va at the node Na at a reference voltage Vref. The operational amplifier circuit 31 has a non-inverting input terminal to receive the reference voltage Vref, an inverting input terminal connected to the node Na, and an output terminal connected to the node Nc.

The current source 32 is a circuit to perform control such that the operational amplifier circuit 31 will not be saturated, and a current Ih, which is part of a current Ig flowing through the resistor 30, flows through the current source 32. Specifically, when the current source 32 passes the current Ih, which is the difference between the current Ia flowing to the Wheatstone bridge 11 and the current Ig from the resistor 30, the operational amplifier circuit 31 will not be saturated and the current Ia flows to the Wheatstone bridge 11.

Here, when the circuit 310 is used for a long period of time, the resistance values of the resistors 20 to 23 change, as in the circuit 300. Meanwhile, since the operational amplifier circuit 31 causes the voltage Va at the node Na to be a voltage equal to the reference voltage Vref, the voltage Va at the node Na is no longer affected by the change in the resistance values of the resistors 20 to 23.

Further, the voltage Vc at the node Nc may change with the resistance value of the combined resistance Ra of the Wheatstone bridge 11. However, the type of the resistors 20 to 23 and the type of the resistor 30 are set to the same type such that the resistance values of both of them will be the same resistance value R1, and thus the circuit 310 is designed such that the change in the resistance values of the resistors 20 to 23 will be the same as the change in the resistance value of the resistor 30, so that the voltage (Va−Vc) will be constant.

Specifically, even if the resistance value R1 of the resistors 20 to 23 changes and the combined resistance Ra changes, the resistance value of the resistor 30 changes as with the resistance values of the resistors 20 to 23, and thus the current Ia will change in inverse proportion to the change in the resistance values of the resistors 20 to 23. As a result, even if the combined resistance Ra changes, the voltage Vc at the node Nc remains substantially constant, and the voltage (Va−Vc) remains substantially constant as well.

For example, as described above, even if the resistance values of the resistors 20 to 23 decrease by 10%, resulting in 0.9×R1, the resistance value R2 of the resistor 30 also results in 0.9×R1, and the current Ig results in (1/0.9) times, and thus the current Ia also results in (1/0.9) times the value before the change. Further, since the combined resistance Ra also results in 0.9×R1, the voltage Vc at the node Nc will be substantially constant, and since the voltage (Va−Vc) is a voltage obtained by multiplying the combined resistance Ra by the current Ia, the voltage (Va−Vc) will be substantially constant regardless of the change in the resistance values of the resistors 20 to 23.

However, as will be described later in detail, strictly speaking, the combined resistance Ra of the Wheatstone bridge 11 will be greater than the resistance value R1 when considering the parasitic resistance of the wirings 110a to 110d. Thus, the change in the resistance value of the combined resistance Ra will not be the same as the change in the resistance value of the resistor 30. Accordingly, it becomes difficult to compensate for the change in the resistance values of the resistors 20 to 23 by the change in the resistance value of the resistor 30, and thus the combined resistance Ra changes with the change in the resistance values of the resistors 20 to 23, and in association therewith, the voltage Vc at the node Nc changes, which affects the voltage (Va−Vc).

Thus, it is needed to suppress the influence of the change in the resistance values of the resistors 20 to 23 on the voltage Vc at the node Nc. The following describes, with reference to FIG. 3, an integrated circuit 10 that achieves this.

Embodiment

<<<Configuration of Integrated Circuit 10>>>

Figure 3:
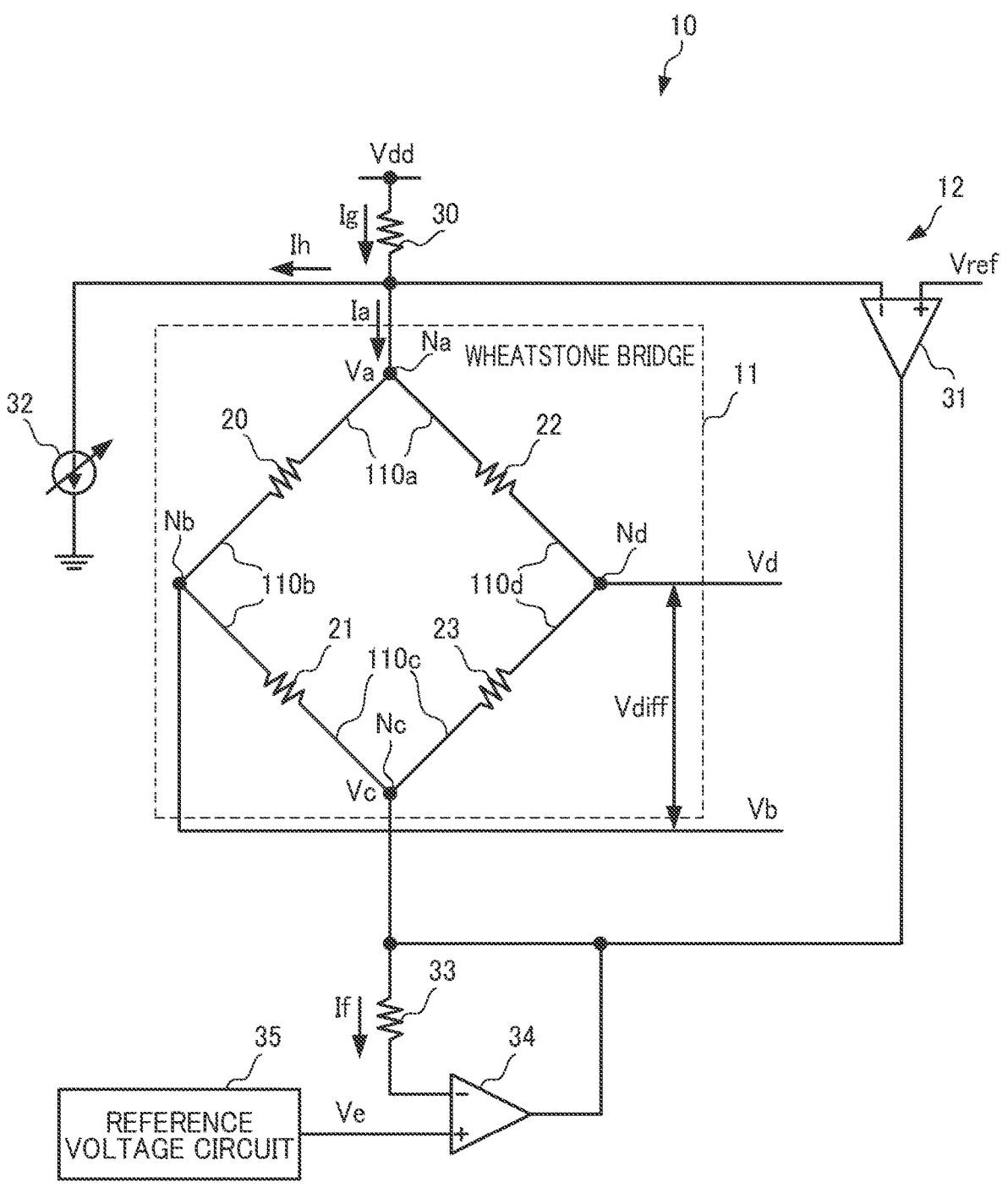
FIG. 3 is a diagram illustrating an example of an integrated circuit 10.

FIG. 3 is a diagram illustrating a configuration of an integrated circuit 10 according to an embodiment of the present disclosure. The integrated circuit 10 is a circuit configured to output a differential voltage Vdiff according to the pressure applied to the Wheatstone bridge 11. The integrated circuit 10 includes the Wheatstone bridge 11 and a bias voltage circuit 12.

<<Configuration of Wheatstone Bridge 11>>

Figure 4:
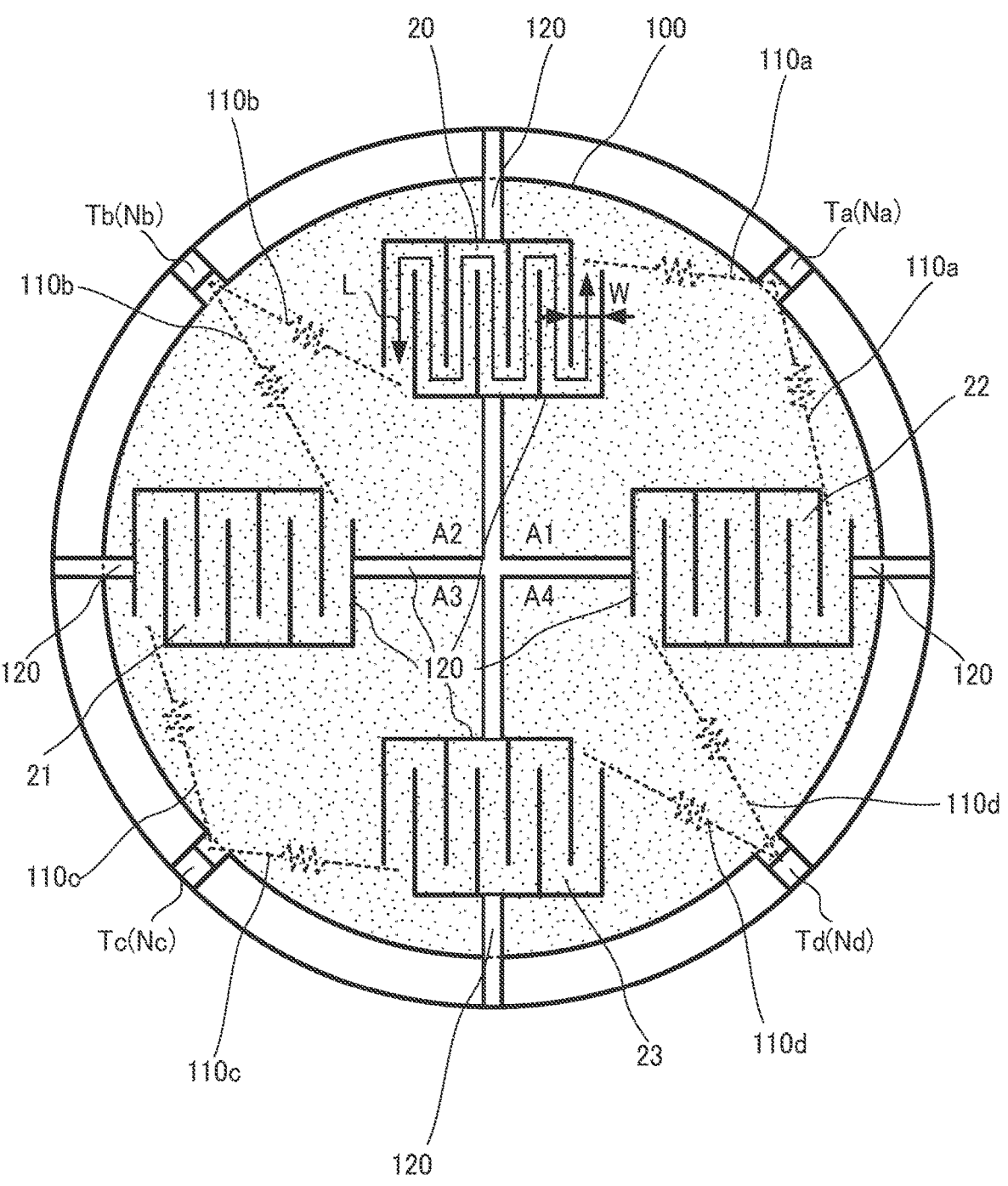
FIG. 4 is a diagram illustrating a configuration example of a Wheatstone bridge 11.

As illustrated in FIG. 4, the diaphragm 100 is formed on a semiconductor substrate, which is a P-type silicon semiconductor substrate, for example. Although a cross-sectional configuration thereof is omitted here for convenience, an N-well region is formed on the front surface side of the diaphragm 100. P-type diffusion regions (gray-colored portions in FIG. 4), which result in the resistors 20 to 23 and wirings 110a to 110d, are formed in most of the N-well region, as diffusion regions shallower than the N-well region.

The resistors 20 to 23 and the wirings 110a to 110d are formed as part of the P-type diffusion regions, and the areas in which the wirings 110a to 110d are formed are referred to as areas A1 to A4, respectively. Oxide films 120 are formed in areas other than those areas of the resistors 20 to 23 and the wirings 110a to 110d, thereby separating them into the areas A1 to A4. Note that the areas A1 to A4 are electrically connected through the resistors 20 to 23, respectively. Further, the resistors 20 to 23 are diffused resistors separated by the oxide films 120, to have limited widths.

Specifically, in the front surface of the N-well region, the wiring 110a in the area A1 and the wiring 110b in the area A2 are electrically connected through the resistor 20, and the wiring 110b in the area A2 and the wiring 110c in the area A3 are electrically connected through the resistor 21. Further, the wiring 110c in the area A3 and the wiring 110d in the area A4 are electrically connected through the resistor 23, and the wiring 110a in the area A1 and the wiring 110d in the area A4 are electrically connected through the resistor 22.

Further, the resistance values of the resistors 20 to 23 are expressed as the resistance value $R1 = \rho s \times L/W$, where $\rho s$ is the sheet resistance value of the resistors 20 to 23, L is the length, and W is the width. In an embodiment of the present disclosure, the resistors 20 to 23 are designed to form a meandering pattern in order to reduce the layout area thereof. However, the present disclosure is not limited to the meandering pattern, and the resistors 20 to 23 may be formed in a strip shape and connected in series or in parallel.

Terminals Ta to Td correspond to the nodes Na to Nd, respectively, and are connected through a plurality of contacts (not illustrated) to the P-type diffusion regions that are the areas A1 to A4 of the wirings 110a to 110d, respectively. The terminals Ta to Td are formed not on the diaphragm 100 but in the region surrounding the diaphragm 100. Note that, for example, when a current flows from the node Na to the resistor 20, it flows through part of the diffused resistor along the wiring 110a, so that a parasitic resistance occurs in the wiring 110a from the node Na to the resistor 20 as given by the dotted line. The same applies to other combinations of the resistors 20 to 23 and the wirings 110a to 110d connected to the nodes Na to Nd, respectively. Note that the resistors 20 to 23 correspond to a "first resistor", a "second resistor", a "third resistor", and a "fourth resistor", respectively, and the nodes Na to Nd correspond to a "first node", a "second node", a "third node", and a "fourth node", respectively.

<<Bias Voltage Circuit 12>>

The bias voltage circuit 12 is a circuit to apply a predetermined voltage (Va–Vc) to the Wheatstone bridge 11 even if the resistance values of the resistors 20 to 23 change due to long-term use. The bias voltage circuit 12 includes the resistor 30, a resistor 33, the operational amplifier circuit 31, an operational amplifier circuit 34, the current source 32, and a reference voltage circuit 35. The current Ig according to the voltage difference between the power supply voltage Vdd and the voltage Va at the node Na and the resistance value R1 of the resistor 30 flows through the resistor 30. Note that the resistor 30 corresponds to a "sixth resistor," the operational amplifier circuit 31 corresponds to a "second operational amplifier circuit", the reference voltage Vref corresponds to a "predetermined voltage", and the current source 32 corresponds to a "bias current circuit", and the current Ih corresponds to a "part of a current flowing through the sixth resistor".

Note that the type of the resistor 30 is the same p-type diffused resistor as the type of the resistors 20 to 23, and is a diffused resistor having a sheet resistance value ρs formed on the same semiconductor substrate by the same manufacturing process. The resistance value of the resistor 30 is also the same as the resistance value R1 of the resistors 20 to 23. Accordingly, as described above, even if the resistance values of the resistors 20 to 23 change due to long-term use, the resistance value of the resistor 30 also changes in the same way, which reduces change in the voltage (Va–Vc) between the voltages Va and Vc.

Further, the integrated circuit 10 may be constituted by two semiconductor chips. Such two semiconductor chips are constituted by a pressure sensing chip including the diaphragm 100 and a signal processing chip configured to perform signal processing, such as an application specific integrated circuit (ASIC). In this case, the resistor 30 and the resistors 20 to 23 are formed at the pressure sensing chip. Note that the operational amplifier circuits 31 and 34, the current source 32, and the reference voltage circuit 35 are formed at the signal processing chip.

The resistor 33, the operational amplifier circuit 34, and the reference voltage circuit 35 configures a circuit to maintain the voltage value of the voltage Vc at the node Nc at a voltage Ve. Specifically, one end of the resistor 33 is connected to the node Nc. The operational amplifier circuit 34 has an inverting input terminal to which the other end of the resistor 33 is connected, a non-inverting input terminal configured to receive the voltage Ve from the reference voltage circuit 35, and an output terminal connected to the node Nc. Accordingly, the resistor 33, the operational amplifier circuit 34, and the reference voltage circuit 35 operate as a circuit configured to maintain the voltage Vc at the node Nc at the voltage Ve. Further, the resistor 33 corresponds to a "fifth resistor", and the operational amplifier circuit 34 corresponds to a "first operational amplifier circuit".

Figure 5:
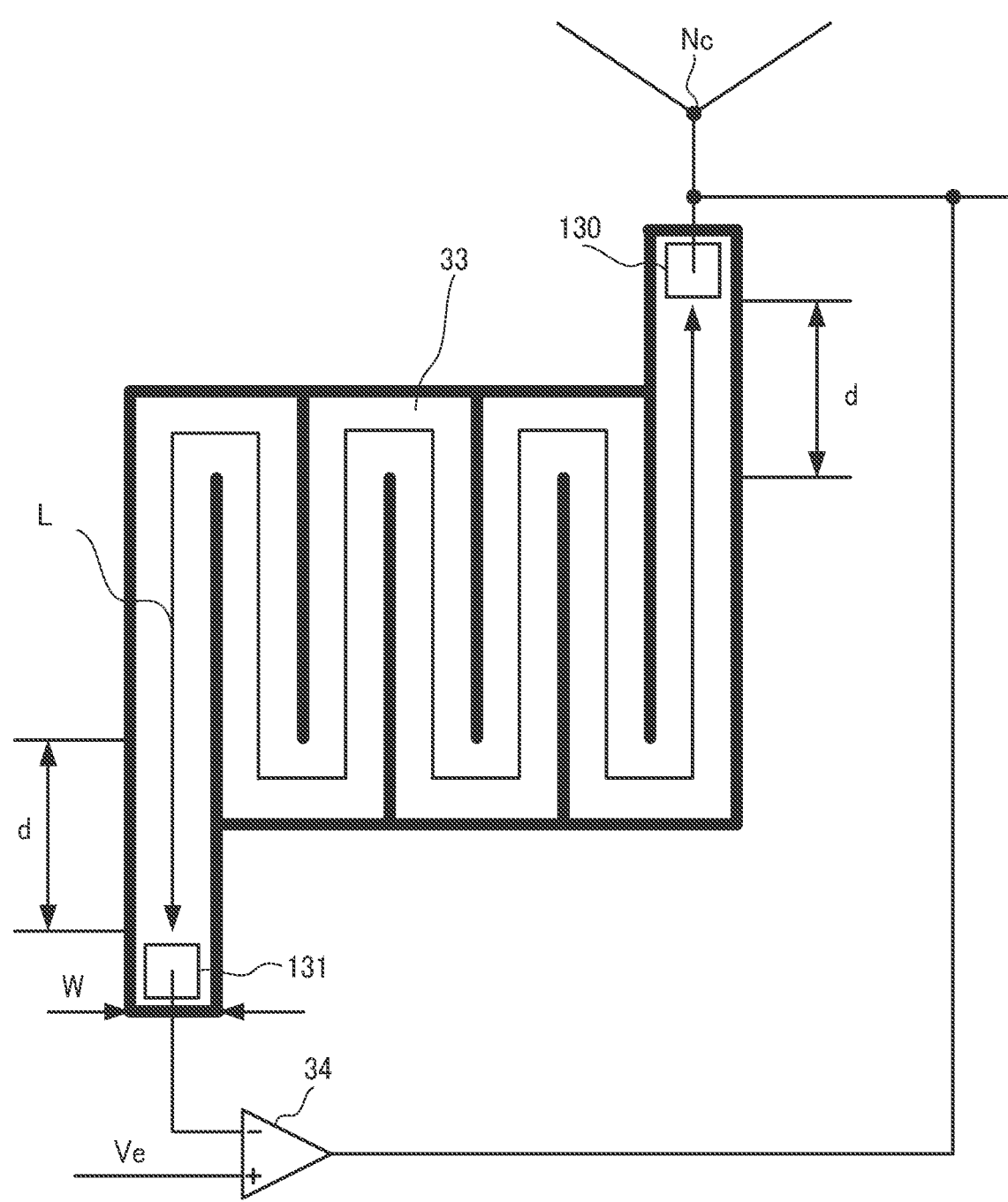
FIG. 5 is a diagram illustrating a configuration example of a resistor 33.

Note that the resistance value of the resistor 33 may be set to the same resistance value as of the resistors 20 to 23, but it is desirable to set it to a resistance value that takes into account the parasitic resistance occurring in the wirings 110a to 110d in FIG. 4. Specifically, the resistor 33 is constituted by a P-type diffusion region electrically separated by an oxide film so as to have the same meandering pattern as that of the resistors 20 to 23. Further, as illustrated in FIG. 5, the resistor 33 is constituted by a P-type diffused resistor having the sheet resistance value ρs formed on the same semiconductor substrate by the same manufacturing process as in the resistors 20 to 23. Further, the length L of the resistor 33 is longer than the length L of the resistors 20 to 23 by 2d, taking into account the parasitic resistance in the wirings 110a to 110d, and the width W of the resistor 33 is the same as the width W of the resistors 20 to 23. Accordingly, when considering the resistance values of the resistors 20 to 23 while taking into account the resistance value of the parasitic resistance occurring in the wirings 110a to 110d, the resistance values of the resistors 20 to 23 are equal to the resistance value of the resistor 33.

Further, the integrated circuit 10 may be constituted by two semiconductor chips. Such two semiconductor chips may be constituted by a pressure sensing chip including the diaphragm 100 and a signal processing chip configured to perform signal processing, such as an ASIC. In this case, the resistor 33 and the resistors 20 to 23 are formed at the pressure sensing chip. Note that the operational amplifier circuits 31 and 34, the current source 32, and the reference voltage circuit 35 are formed at the signal processing chip.

Note that in order to reduce the change in the voltage (Va–Vc) between the voltages Va and Vc, the type of the resistors is represented as the P-type diffused resistor in the above, but the type of the resistor 30 and the type of the resistors 20 to 23 may be different, and the type of the resistor 33 and the type of the resistors 20 to 23 may be different, in the integrated circuit 10 illustrated in FIG. 3 including the operational amplifier circuits 31 and 34. The voltage Va at the node Na is controlled so as to reach the reference voltage Vref in the operational amplifier circuit 31. The voltage Vc at the node Nc is controlled so as to be the voltage Ve of the reference voltage circuit 35 in the operational amplifier circuit 34. Accordingly, change in the voltage (Va–Vc) between the nodes Na and Nc can be suppressed.

Further, pads 130 and 131, which are connected to portions extending from the resistor 33 through a plurality of contacts, are provided at two ends of the resistor 33, respectively. The node Nc is connected to the pad 130, while the inverting input terminal of the operational amplifier circuit 34 is connected to the pad 131.

Figure 6:
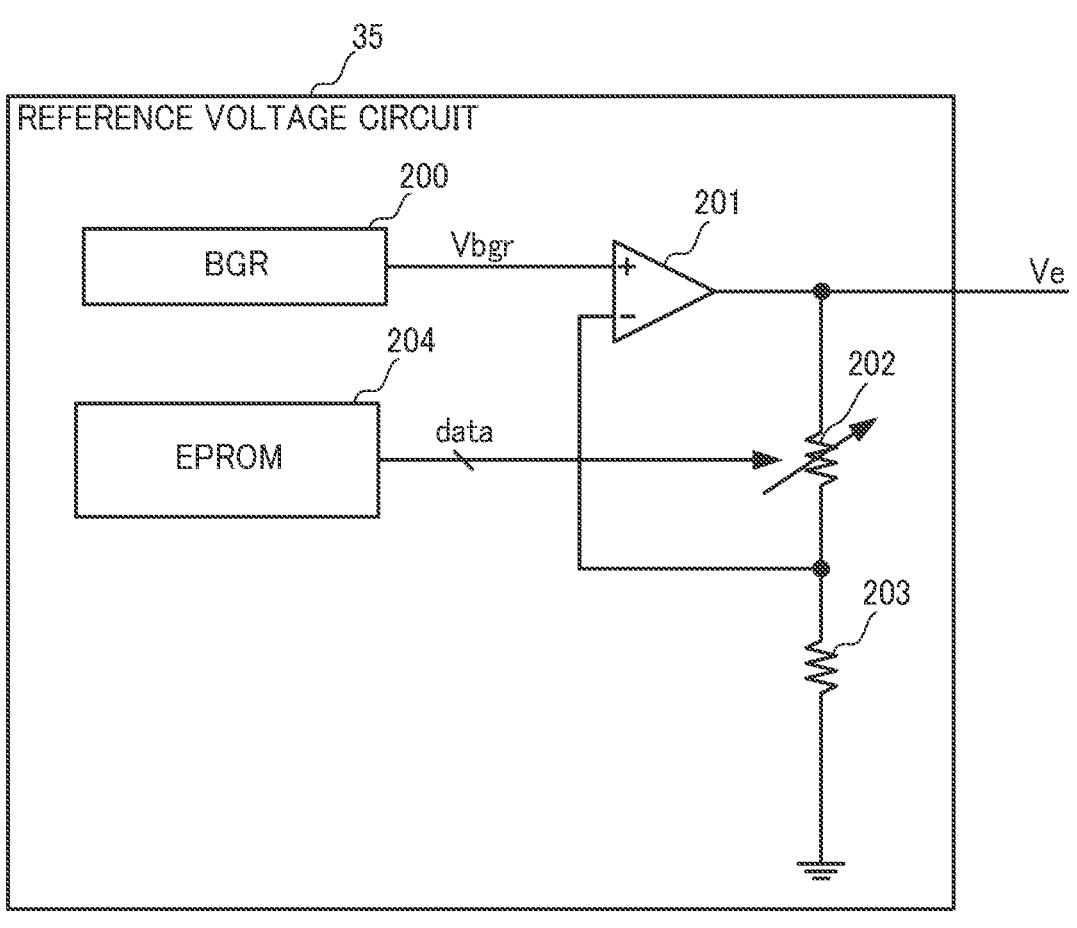
FIG. 6 is a diagram illustrating an example of a reference voltage circuit 35.

As illustrated in FIG. 6, the reference voltage circuit 35 is, for example, a circuit configured to output the voltage Ve based on a band gap voltage Vbgr. The reference voltage circuit 35 adjusts the level of the voltage Ve and outputs the resultant voltage Ve, and includes a band gap reference circuit 200, an operational amplifier circuit 201, a variable resistor 202, a resistor 203, and an EPROM 204. Note that the voltage Ve corresponds to a "reference voltage".

The band gap reference circuit (BGR) 200 outputs the voltage Vbgr. The operational amplifier circuit 201 has a non-inverting input terminal configured to receive the voltage Vbgr, an inverting input terminal configured to receive a voltage obtained by dividing the voltage Ve by the variable resistor 202 and the resistor 203, and an output terminal configured to output the voltage Ve.

Further, the variable resistor 202 is a resistor whose resistance value changes based on the bit data from the EPROM 204. Further, since the voltage Ve changes with the resistance value of the variable resistor 202, the voltage Ve is adjusted by the bit data from the EPROM 204. The bit data is written into the EPROM 204 during manufacturing of the integrated circuit 10 so that the reference voltage circuit 35 outputs the voltage Ve that is equal to the voltage Vc at which the operational amplifier circuit 31 operates.

Note that although the circuit using the band gap reference voltage has been described as the reference voltage circuit 35, the present disclosure is not limited thereto. A voltage divider circuit that divides the power supply voltage Vdd may be configured using a variable resistor controlled by the EPFOM 204, for example, to thereby output the voltage Ve. Alternatively, a constant current source and a variable resistor that is controlled by the EPROM 204, for example, may be combined, to thereby output the output voltage Ve.

<<<Change in Differential Voltage Vdiff According to Pressure>>>

The diaphragm 100 deforms when pressure is applied thereto. Further, the Wheatstone bridge 11 is formed on the diaphragm 100, and thus when pressure is applied to the diaphragm 100, the shapes of the resistors 20 to 23 change, and accordingly the resistance values of the resistors 20 to 23 change, and the Wheatstone bridge 11 outputs the differential voltage Vdiff according to the pressure.

First, a description will be given of the case in which no pressure is applied to the Wheatstone bridge 11. The resistance values of the resistors 20 to 23 are referred to as resistance value R1. Thus, the resistance value of the combined resistance Ra of the Wheatstone bridge 11 when a voltage is applied to the nodes Na and Nc results in the resistance value R1. Since the voltage difference (Va–Vc) between the voltages Va and Vc is applied to the combined resistance Ra, the current Ia is as follows.

$$Ia = (Va - Vc)/R1 \qquad \text{Formula (1)}$$

Further, since the resistance values of the resistors 20 to 23 are the same, that is, the resistance value R1, the current value of the current obtained by shunting the current Ia from the node Na to flow through the nodes Nb and Nd, results in a current value of Ia/2.

In this case, the voltages Vb and Vd are given as follows, and the differential voltage Vdiff results in 0 V.

$$Vb = R1 \times Ia/2 + Vc \qquad \text{Formula (2)}$$

$$Vd = R1 \times Ia/2 + Vc \qquad \text{Formula (3)}$$

$$Vdiff = Vd - Vb = 0 \qquad \text{Formula (4)}$$

Meanwhile, when pressure is applied to the Wheatstone bridge 11, the respective resistance values of the resistors 20 to 23 change, the formulas (2) to (4) do not hold, and the differential voltage Vdiff does not result in 0 V.

Specifically, assuming that the resistance value of the resistor 20 changes from the resistance value R1 to a resistance value of R1+r1, the current Ia and the voltages Vb and Vd are given as follows.

$$Ia = (Va - Vc)/Ra \qquad \text{Formula (5)}$$

However, $$Ra = 2R1 \times (2R1 + r1)/(4R1 + r1) \qquad \text{Formula (6)}$$

$$Vb = R1 \times Ia0 + Vc \qquad \text{Formula (7)}$$

However, the current Ia0 is a current flowing through the node Nb, and gives $$Ia0 = Ra \times Ia/(2R1 + r1) \qquad \text{Formula (8)}$$

$$Vd = R1 \times Ia1 + Vc \qquad \text{Formula (9)}$$

However, the current Ia1 is a current flowing through the node Nd, $$Ia1 = Ra \times Ia/2R1 \qquad \text{Formula (10)}$$

Accordingly, the differential voltage Vdiff is as follows, and the differential voltage Vdiff does not result in 0 V.

$$Vdiff = Vd - Vb \qquad \text{Formula (11)}$$

$$= Ia \times R1 \times r1/(4R1 + r1)$$

$$= (Va - Vc) \times r1/2/(2R1 + r1)$$

<<<Operation of Integrated Circuit 10 when Resistance Values of the Resistors 20 to 23 Change Due to Long-Term Use>>>

The following describes the operation of the integrated circuit 10 when the resistance values of the resistors 20 to 23 change due to long-term use, with reference to FIG. 3.

For example, it is assumed that the resistance values of the resistors 20 to 23 decrease by 10% from the resistance value R1, resulting in a resistance value of 0.9×R1. In this case, as described above, since the resistor 30 is designed to have a type that is the same as the type of the resistors 20 to 23, and thus the resistance value of the resistor 30 also results in a resistance value of 0.9×R1 in the same way.

Further, since the voltage Va at the node Na is maintained at the reference voltage Vref by the operational amplifier circuit 31, the voltage applied to the resistor 30 does not change at (Vdd–Vref). Accordingly, the current value of the current Ig changes from a current value of (Vdd–Vref)/R1 to a current value of (Vdd–Vref)/(0.9×R1).

Then, the resistance value of the combined resistance Ra of the Wheatstone bridge 11 changes from the resistance value R1 to a resistance value of (0.9×R1), but the voltage (Va–Vc) applied to the Wheatstone bridge 11 does not change, since the current value of the current Ia has changed to the current value of (Vdd−Vref)/(0.9×R1). Further, since the voltage Va is constant at the reference voltage Vref and the voltage (Va−Vc) does not change, the voltage Vc at the node Nc does not change, either. However, it is assumed that the current Ih passed by the current source 32 is not considered.

However, strictly speaking, the combined resistance Ra of the Wheatstone bridge 11 is greater than the resistance value R1 when considering the parasitic resistance of the wirings 110a to 110d, and thus the change in the resistance value of the combined resistance Ra is not the same as the change in the resistance value of the resistor 30. Further, it is not practical to form the resistor 30 into the meandering pattern of the resistors 20 to 23, because it affects costs in relation to chip size and the like.

Thus, as described with reference to FIG. 2, the voltage Vc at the node Nc is affected by the change in the resistance values of the resistors 20 to 23. When the voltage (Va−Vc) changes, the sensor sensitivity of the Wheatstone bridge 11 changes as described above.

Further, in order to suppress the change in the sensor sensitivity of the Wheatstone bridge 11, it is needed to control the voltage Vc at the node Nc so as not to change. In order to implement this, a circuit including the resistor 33, the operational amplifier circuit 34, and the reference voltage circuit 35 operates to maintain the voltage Vc at the node Nc at the voltage Ve, which is the initial voltage Vc, to thereby maintain the voltage (Va−Vc) at a predetermined voltage.

Specifically, the circuit including the resistor 33, the operational amplifier circuit 34, and the reference voltage circuit 35 operates as follows. When the voltage Vc rises above the voltage Ve, a current If seems to flow through the resistor 33 in the direction of an arrow in FIG. 3. However, since the input impedance at the inverting input terminal of the operational amplifier circuit 34 is theoretically infinite, the current If does not flow. Accordingly, the operational amplifier circuit 34 lowers the voltage Vc until it becomes equal to the voltage Ve so that the current If does not flow.

Conversely, when the voltage Vc drops below the voltage Ve, the current If seems to flow through the resistor 33 in the direction opposite to the direction of the arrow in FIG. 3, but the operational amplifier circuit 34 raises the voltage Vc until it becomes equal to the voltage Ve so that the current If does not flow, as in the case where the voltage Vc rises.

Accordingly, even if the resistance values of the resistors 20 to 23 change due to long-term use, the integrated circuit 10 can maintain the voltage (Va−Vc) at a predetermined voltage, thereby being able to suppress reduction in the accuracy of the output voltage of the Wheatstone bridge 11.

===Modifications===

The operation when the integrated circuit 10 includes the Wheatstone bridge 11 and the bias voltage circuit 12 has been described above. However, when a predetermined voltage such as the power supply voltage Vdd is applied to the node Na, the resistor 30, the operational amplifier circuit 31, and the current source 32 are not needed.

Even if these circuits do not exist, the voltage (Va−Vc) between the nodes Na and Nc can be maintained constant, if the circuit including the resistor 33, the operational amplifier circuit 34, and the reference voltage circuit 35 can maintain the voltage at the node Nc at the predetermined voltage Ve. This makes it possible to suppress reduction in the accuracy of the output voltage of the Wheatstone bridge 11.

===Summary===

The integrated circuit 10 according to an embodiment of the present disclosure has been described above. The integrated circuit 10 comprises the Wheatstone bridge 11 and the bias voltage circuit 12. The Wheatstone bridge 11 includes the resistors 20 to 23. The bias voltage circuit 12 includes the resistor 33 and the operational amplifier circuit 34. The operational amplifier circuit 34 maintains the voltage Vc at the node Nc at the voltage Ve, and maintains the voltage (Va−Vc) between the nodes Na and Nc constant. This makes it possible to suppress reduction in the accuracy of the output voltage of the Wheatstone bridge.

In addition, when the type of the resistors 20 to 23 and the type of the resistor 33 are the same, they are diffused resistors having the same conductivity type and the sheet resistance value ρs formed on the same semiconductor substrate by the same manufacturing process. As a result, the resistance values of the resistors 20 to 23 and the resistance value of the resistor 33 change in the same way even if the integrated circuit 10 is used for a long period of time. Accordingly, in maintaining the voltage (Va−Vc) between the nodes Na and Nc constant, the operations of the resistor 33 and the operational amplifier circuit 34 are suppressed. Further, the type of the resistors 20 to 23 and the type of the resistor 33 may be different. With the voltage Vc at the node Nc being controlled by the operational amplifier circuit 34 according to the voltage Ve of the reference voltage circuit 35, it is possible to suppress change in the voltage (Va−Vc) between the nodes Na and Nc.

Further, the resistance values of the resistors 20 to 23 and the resistance value of the resistor 33 are equal. This improves the accuracy when maintaining the voltage (Va−Vc) between the nodes Na and Nc constant.

Further, the bias voltage circuit 12 further includes the operational amplifier circuit 31. This makes it possible to maintain the voltage Va at the node Na at the reference voltage Vref. Accordingly, the voltage (Va−Vc) between the nodes Na and Nc can be maintained at the predetermined voltage.

Further, the bias voltage circuit 12 further includes the resistor 30. This makes it possible to control the current Ia flowing through the node Na, according to the voltage value of the reference voltage Vref.

Further, when the type of the resistors 20 to 23 is the same as the type of the resistor 30, they are diffused resistors having the same conductivity type and the sheet resistance value ρs formed on the same semiconductor substrate by the same manufacturing process. This causes the rate of change in the resistance value of the resistor 30 and the rate of change in the resistance values of the resistors 20 to 23 when the integrated circuit 10 is used for a long period of time to be the same, which suppresses change in the voltage (Va−Vc). Further, the type of the resistors 20 to 23 and the type of the resistor 30 may be different. The voltage Va at the node Na is controlled by the operational amplifier circuit 31, according to the reference voltage Vref. Further, with the voltage Vc at the node Nc being controlled by the operational amplifier circuit 34 according to the voltage Ve of the reference voltage circuit 35, it is possible to suppress change in the voltage (Va–Vc) between the nodes Na and Nc.

The bias voltage circuit 12 further includes the current source 32. This makes it possible to set the voltage Vc at the node Nc so that the operational amplifier circuit 31 will be not saturated.

Further, the bias voltage circuit 12 further includes the reference voltage circuit 35. This enables the bias voltage circuit 12 to maintain the voltage Vc at the node Nc at the predetermined voltage.

The present disclosure is directed to provision of an integrated circuit capable of suppressing reduction in the accuracy of an output voltage of a Wheatstone bridge.

According to the present disclosure, it is possible to provide an integrated circuit capable of suppressing reduction in the accuracy of an output voltage of a Wheatstone bridge.

An embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. An integrated circuit comprising:
a Wheatstone bridge having
    a first node on a high potential side thereof,
    a second node,
    a third node on a low potential side thereof, the first node having a higher potential than the third node, and
    a fourth node,
the Wheatstone bridge including:
    a first resistor connected between the first node and the second node,
    a second resistor connected between the second node and the third node,
    a third resistor connected between the first node and the fourth node, and
    a fourth resistor connected between the fourth node and the third node, the Wheatstone bridge being configured to have a predetermined voltage at the first node; and
    a bias voltage circuit, including
        a fifth resistor having
            a first end connected to the third node, and
            a second end; and
        a first operational amplifier circuit having
            an inverting input terminal to which the second end of the fifth resistor is connected,
            a non-inverting input terminal configured to receive a reference voltage lower than the predetermined voltage, and
            an output terminal connected to the third node.

2. The integrated circuit according to claim 1, wherein the first resistor, the second resistor, the third resistor, the fourth resistor, and the fifth resistor are of a same type.

3. The integrated circuit according to claim 2, wherein a resistance value of each of the first resistor, the second resistor, the third resistor, and the fourth resistor is equal to a resistance value of the fifth resistor.

4. The integrated circuit according to claim 1, wherein the bias voltage circuit further includes a second operational amplifier circuit having
    a non-inverting input terminal configured to receive the predetermined voltage,
    an inverting input terminal connected to the first node, and
    an output terminal connected to the third node.

5. The integrated circuit according to claim 4, wherein the bias voltage circuit further includes a sixth resistor having
    a first end configured to receive a power supply voltage, and
    a second end connected to the first node.

6. The integrated circuit according to claim 5, wherein the first resistor, the second resistor, the third resistor, the fourth resistor, the sixth resistor are of a same type.

7. The integrated circuit according to claim 5, wherein the bias voltage circuit further includes a bias current circuit through which part of a current flowing through the sixth resistor flows.

8. The integrated circuit according to claim 1, wherein the bias voltage circuit further includes a reference voltage circuit configured to adjust a level of the reference voltage and output a resultant reference voltage.

\* \* \* \* \*